United States Patent [19]

Hirai et al.

[11] Patent Number: 4,586,980
[45] Date of Patent: May 6, 1986

[54] PATTERN FORMING METHOD

[75] Inventors: Yutaka Hirai, Tokyo; Yoshinori Tomida; Hiroshi Matsuda, both of Yokohama; Yukuo Nishimura, Sagamihara, all of Japan

[73] Assignee: Canon Kabushiki Kaisha, Tokyo, Japan

[21] Appl. No.: 702,217

[22] Filed: Feb. 15, 1985

[30] Foreign Application Priority Data

Feb. 20, 1984 [JP] Japan .................. 59-28793

[51] Int. Cl.$^4$ ............... C23F 1/00; H01L 21/306; B44C 1/22; C03C 15/00
[52] U.S. Cl. .................. 156/655; 156/656; 156/657; 156/662; 156/667; 252/79.2; 252/79.3; 427/264
[58] Field of Search .......... 430/314, 315, 317; 156/643, 655, 656, 657, 662, 668, 904, 667; 427/38, 39, 259, 264, 272, 282; 252/79.2, 79.3; 204/192 EC

[56] References Cited

U.S. PATENT DOCUMENTS

4,119,483 10/1978 Hubsch et al. .................. 156/655
4,502,914 3/1985 Trumpp et al. .................. 156/643

Primary Examiner—William A. Powell
Attorney, Agent, or Firm—Fitzpatrick, Cella, Harper & Scinto

[57] ABSTRACT

A pattern of a monomolecular film or a monomolecular built-up film is formed on a base through the steps of providing a lift-off layer on a base on which a monomolecular film or a monomolecular built-up film is to be deposited, depositing the monomolecular film or the monomolecular built-up film on the base and the lift-off layer, and removing the lift-off layer from the base.

9 Claims, 18 Drawing Figures

PATTERN FORMING METHOD

BACKGROUND OF THE INVENTION

1. Field of the Invention

The present invention relates to a novel pattern forming method and, more specifically, a method for forming a monomolecular film or a monomolecular built-up film on a base.

2. Description of the Prior Art

Until recently, inorganic substances, which are relatively easy to handle, have been exclusively used in semiconductor and optics technology. One reason might be that the technology of organic chemistry was far behind that of inorganic chemistry.

However, the technology in organic chemistry has strikingly progressed in recent years and, moreover, the development of the material composed of the inorganic substance seems to have slowed down. Therefore, a functional organic material surpassing the inorganic substances has been desired. The advantage of the organic material is low price, easy production, excellent functional properties and so on. Further, the organic materials have been developed recently which have superior heat-resistance and mechanical strength to those in the prior arts. With such a technical back ground, several reserach organizations presented recently the idea on utilizing organic thin film in place of the conventional inorganic thin film for a part or the whole of functional portion (principally thin layer portion) of an integrated circuit device including a logical element, a memory device, a photoelectric transducing device, etc. and of optical devices including microlens array, an optical wavepath, etc. They also presented the idea on preparing a molecular electron device by giving a function of a logic element, memory device or the like to an organic molecule, or on preparing a logic element comprised of bio-material (e.g. bio-chips).

A monomolecular built-up method (or Langmuir-Blodgett method) is known as a method for forming a thin film in fabrication of the above-mentioned various devices using the said organic material.

Langmuir-Blodgett method is a method for preparing a monomolecular film or a built-up film of monomolecular layer utilizing the phenomena in which a molecule having both hydrophilic and hydrophobic groups, when the balance of the both groups (hydrophilic and hydrophobic balance) is appropriate, forms a layer on the water surface with the hydrophilic group orienting downwards.

With this method, the formation of the monomolecular film or the monomolecular built-up film on the desired substrate is carried out generally by raising or lowering the substrate vertically through the water surface having the developed monomolecular film composed of a layer of the above-mentioned molecule. By using a single kind of molecule developed on the water surface, the monomolecular film or the monomolecular built-up film comprising the single kind of molecule may be formed. On the other hand, when two or more kinds of molecule dissolved in a vaporizable solvent is developed on the water surface, the mixed monomolecular film or the mixed monomolecular built-up film of a uniform constitution comprising two or more kinds of molecule may be formed by transferring the developed solution on the substrate.

For fabricating said various devices with the deposited monomolecular film or the monomelecular built-up film having various functions such as a photoconductivity and the like, it is necessary to control a two-dimensional arrangement of the monomolecular film or the monomolecular built-up film. However, in the above method, the two-dimensional patterning could not be controlled because the monomolecular film or the monomolecular built-up film is formed on the whole surface of the substrate, except where a photoresist for a lithography using a special photopolymerization property is utilized, that is, except where the molecule constituting the monomolecular film or the monomolecular built-up film has a property of photoresist.

SUMMARY OF THE INVENTION

An object of the present invention is to provide a pattern forming method free from the above-mentioned drawbacks.

Another object of the present invention is to provide a pattern forming method enabling the control of a two-dimensional arrangement of a monomolecular film or a monomolecular built-up film.

According to the present invention, there is provided a pattern forming method, which comprises steps of providing a lift-off layer on a base on which a monomolecular film or a monomolecular built-up film is to be deposited, depositing the monomolecular film or the monomolecular built-up film on the base and the lift-off layer, and removing the lift-off layer from the base, thereby forming the pattern of the monomolecular film or the monomolecular built-up film on the base.

DETAILED DESCRIPTION OF THE PREFERRED EMBODIMENTS

The term "base" used in the present invention means a site on which the monomolecular film or the monomolecular built-up film is deposited in accordance with the predetermined pattern. As such site, there may be mentioned, for example, substrates comprising the inorganic substance such as glass, $SiO_2$ and the like, the substrate comprising the organic substance such as polyethylene, polyethylene terephthalate, polyimide and the like, and the substrate comprising Al, Ta, W, In, Cu and the like and alloy thereof which are used in the various semiconductor devices or the like as described above, and the various layers provided on these substrates, for example, a vapor-deposited metal film of Al, Ta, W, In, Cu or the like, an amorphous material of silicon, germanium or the like, a polycrystal or a single crystal semiconductor film, a conductive oxide glass film of $SnO_2$, ITO ($In_2O_3+SnO_2$) or the like, and a molecular amorphous semiconductor film of $SiO_2$, $Al_2O_3$, $ZrO_2$, $Si_3N_4$, BN, $Ta_2O_3$ or the like. As such site there may be also mentioned the site in which the monomolecular film or the monomolecular built-up film or the like is further deposited further on the said substrate, the said film, or the film deposited on the substrate.

The lift-off layer according to the present invention is deposited on the base in accordance with the predetermined pattern of the monomolecular film or the monomolecular built-up film, and is removed from the base by an etching or the like procedure after the formation of the monomolecular film or the monomolecular built-up film. As the desired material for constituting the lift-off layer, there is included organic substances, inorganic substances, the metal or the like which has been mentioned for the base. However, there may be used preferably a material which does not etch and deteriorate the monomolecular film nor the monomolecular built-up film deposited on the lift-off layer, nor the base on which the lift-off layer is deposited.

The method for forming the lift-off layer is not limited in particular. Any methods may be used which may give the desired pattern of the said lift-off layer on the base. Such methods include, for example:

(1) a method for forming the lift-off layer of the desired pattern directly on the base in such a manner that the means generally known as a thin film forming method such as vapor deposition, sputtering, plasma CVD or the like in combination with the pattern forming means such as a mask, (2) a method which comprises forming the thin film as the lift-off layer by the above-mentioned method such as plasma CVD method, forming the photoresist, image of the desired pattern by exposing the photosensitive resin such as a dry film and the like on the said thin film through the mask, and removing the unnecessary part of said thin film by etching to form the lift-off layer of the desired pattern (that is, application of the so-called photolithography).

As the useful method for removing the lift-off layer from the base, there may be mentioned the above-described etching or the like. In the said etching, there may be used preferably an etchant which does not etch nor deteriorate the base and the monomolecular film or the monomolecular built-up film deposited on the lift-off layer. As such an etchant, there may be mentioned, for example, an aqueous solution of hydrochloric acid or nitric acid in the case where the lift-off layer is comprised of the metal such as Al, Mo and the like, an aqueous solution of phosphoric acid in the case of $Al_2O_3$, the aqueous solution of hydrofluoric acid in the case of $SiO_2$, and the mixed aqueous solution or the like of hydrofluoric acid and nitric acid in the case of Si, Ge or the like.

The thickness of the lift-off layer is preferably 5 to 10 times the thickness of the monomolecular film or the monomolecular built-up film deposited thereon.

As the molecule constituting the monomolecular film or the monomolecular built-up film according to the present invention, there may be used a molecule having a both hydrophobic group and a hydrophilic group therein.

An alkyl group is the most typical group of the hydrophobic moiety in the said molecule. Either a linear one or a branched one may be used. As other group constituting the hydrophobic moiety in addition to said alkyl group, there may be mentioned, for example, olefine hydrocarbon group such as vinyl, vinylidene, ethynyl and the like, fused ring phenyl group such as phenyl, naphthyl, anthranyl and the like, and chain linear polyphenyl group such as biphenyl, terphenyl and the like. Such a group constitutes the hydrophobic moiety alone or in combination thereof.

As a most typical group constituting the hydrophilic moiety, there may be mentioned, for example, carboxyl group, metal salt thereof and amine salt thereof, sulfonic acid group, metal salt thereof and amine salt thereof, sulfonamide group, amide group, amino group, imino group, hydroxyl group, quaternary amino group, oxyamino group, oxyimino group, diazonium group, quanidine group, hydrazine group, phosphoric acid group, silicic acid group, aluminic acid group or the like. Such a group constitutes the hydrophilic moiety of the above-mentioned molecule alone or in combination thereof.

Having the hydrophobic moiety and the hydrophilic moiety in the molecule is meant by that the molecule contains therein one hydrophilic group and one hydrophobic group, or by that, in the case where the molecule contains therein, more than one hydrophilic group and more than one hydrophobic group, a portion of the molecule is hydrophilic to the other portion while the other portion is hydrophobic to the certain portion in the whole construction of the molecule.

As an example of the above-mentioned molecule constituting the monomolecular film or the monomolecular built-up film, for example, there may be mentioned the molecule which forms the thin film having the desired functional property of the photoconductivity.

(1) The molecule in which the portion having the desired functionality, namely the functional portion (such as $\pi$ electron system) has simultaneously high hydrophilicity (or high hydrophobicity), e.g. copper phthalocyanine, pyrene, triphenylmethane, etc.

(2) The molecule which does not have special hydrophilicity nor hydrophobicity hydrophobic in the functional portion, and which is made hydrophilic or hydrophobic by introducing the hydrophilic group or the hydrophobic group as described above. For example, (a) the molecule in which the functional moiety is placed in the hydrophilic portion: e.g. photoconductive merocyanine pigment having a long chain alkyl substituent, and the like, (b) the molecule in which the functional moiety is placed in the hydrophobic portion: e.g. pyrene combined with a long chain alkyl carboxylic acid, and the like, (c) the molecule in which the functional moiety is placed in or near the central portion, namely, between the hydrophobic moiety and the hydrophilic moiety: e.g. an anthracene derivative, a diazo pigment derivative, and the like, (d) the molecule which has no functional moiety, and is composed of the hydrophobic moiety and the hydrophilic moiety: e.g. a long chain saturated fatty acid such as stearic acid and arachic acid.

An outline of the forming method of the monomolecular film and the monomolecular built-up film according to the present invention is illustrated regarding the case where a film forming apparatus according to Langmuir-Blodgett method well known generally which was designed by a research group of Kuhn is used. In this embodiment, a liquid for developing the monomolecular film is water.

The above-mentioned molecule as the film-forming molecule is dissolved in a volatile solvent such as benzene, chloroform and the like. This solution is added dropwise to the water in a vessel (a trough) with a syringe or the like to form the monomolecular film of the said film forming molecule on an aqueous phase. Then the monomolecular film is controlled by moving a buoy (or a partition wall) provided such that the monomolecular film may not be spread too much by free diffusion on the water surface. Thereby, the development area of the monomolecular film is reduced to apply a surface pressure to the monomolecular film until that film reaches a state of a two dimensional solid film. While maintaining this surface pressure, the substrate is gently moved vertically through the water surface to have the monomolecular film transferred thereon. The monomolecular film may be produced as described above, and the monomolecular built-up film may be formed by repeating the above procedure to a desired degree of built-up.

Figure 4A:
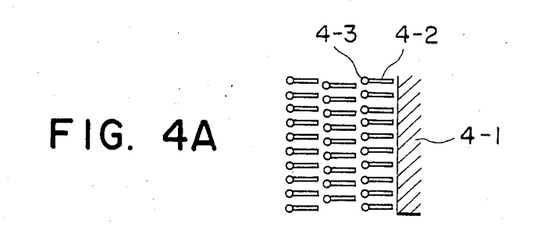
FIGS. 4A–4C is an illustrative view of a built-up pattern of a monomolecular built-up film of the present invention.
Figure 4B:
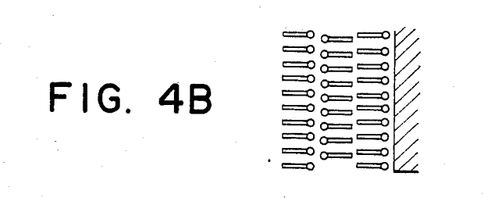
Figure 4C:
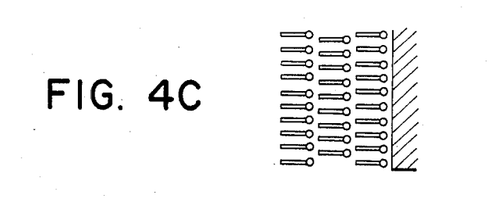

As shown in FIG. 4, the monomolecular built-up film is formed with an uniform orientation relative to the substrate. The monomolecular built-up films classified into three groups of X-, Y- and Z-type may be formed on the substrate. X-type means a construction with hydrophobic moiety 4-2 orienting toward substrate 4-1 side (see FIG. 4A). Z-type means the construction with hydrophilic moiety 4-3 orienting toward subs trate 4-1 side (see FIG. 4C). Y-type means the construction in which X-type and Z-type film are built up alternately (See FIG. 4B). The orientation direction can be controlled by the film forming conditions such as pH, temperature of the water, etc.

In the above description, the monomolecular film or the monomolecular built-up film is formed by using the film forming apparatus of Kuhn. However, the apparatus for forming the monomolecular film or the monomolecular built-up film according to the present invention is not limited to the above-mentioned embodiment. It is possible to use a variety of film-forming apparatuses based on the principle of the Langmuir-Blodgett method such as the horizontal attachment method, the rotary cylinder method and the like.

When the monomolecular film or the monomolecular built-up film according to the present invention is formed by the methods as described above, the support and the lift-off layer on which the monomolecular film or the monomolecular built-up film is to be formed is preferably cleaned sufficiently in advance. If the cleaning of the support and the lift-off layer is insufficient, peeling of the film or the like phenomenon occurs and, thereby, difficulty is encountered in patterning the monomolecule film or the monomolecular built-up film. An embodiment of the cleaning method is described below:

When the support or the lift-off layer comprises glass or quartz, it is immmersed in a chromic acid mixture, is washed with distilled water, and then, is dried with a clean air stream to give a clean surface. Thereby, the surface of the glass or the quartz provided this treatment assumes a complete hydrophilicity. In the case where the base or the lift-off layer comprises ITO, a contaminating layer on the surface is removed by etching slightly with an aqueous hydrochloric acid solution. Thereby, the ITO assumes complete hydrophilicity. The surface of the metal thin film of Al, In, Mo or the like formed by vacuum deposition is oxidized by oxygen in the air after it is formed, and thereby the surface property will change. This oxidation film is removed with the aqueous hydrochloric acid solution to clean the surface. Thereby, the metal thin film assumes complete hydrophilicity. In the case of a semiconductor film of Si, Ge or the like, the oxidation film is also produced on the surface thereof. The oxidation film is removed with hydrofluoric acid to clean the surface. Thereby, the semiconductor film assumes complete hydrophobicity.

The outline of the method according to the present invention is illustrated below referring to FIG. 1 showing the construction of the base in the main step of one embodiment thereof.

FIG. 1 shows a sectional view (perpendicular to a pattern forming surface) of the base in each step. In this embodiment, the base is a flat board-like substrate. The lift-off layer is removed by etching.

Figure 1A:
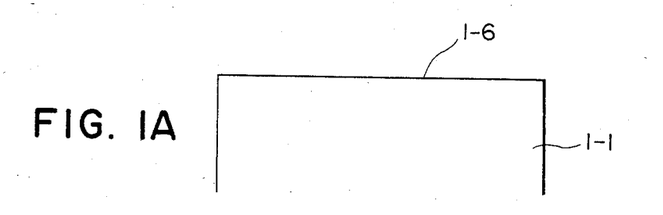
FIGS. 1A–1D shows an embodiment of the method of the present invention.

As shown in FIG. 1A, the pattern forming surface 1-6 of the base, that is, the flat substrate 1-1 in this embodiment is cleaned sufficiently.

Figure 1B:
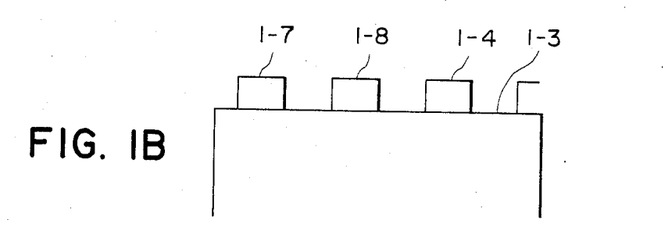

Next, as shown in FIG. 1B, the lift-off layer 1-4 is formed into the desired pattern.

Then, the lift-off layer 1-4 and the portion of the base surface 1-3 on which the layer 1-4 has not been formed are cleaned sufficiently.

Figure 1C:
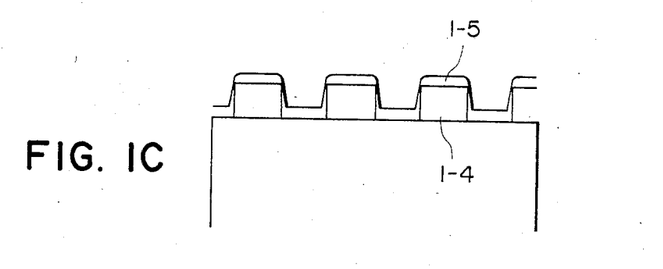

Then, as shown in FIG. 1C, the monomolecular film or the monomolecular built-up film 1-5 is deposited onto the whole surfaces of the lift-off layer 1-4 and the base surface 1-3.

Figure 1D:
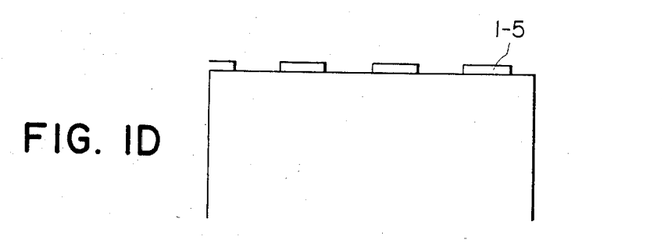

Finally, the lift-off layer 1-4 is removed by etching, so that the lift-off layer together with the monomolecular film or the monomolecular built-up film formed on its surface are removed. Thus the monomolecular film or the monomolecular built-up film 1-5 of the desired pattern is left on the base 1-1 as shown in FIG. 1D, thereby the patterning being completed.

The etching of the lift-off layer 1-4 is accomplished by penetration of the etchant into the stepped portions of the support 1-1 and the lift-off layer.

The penetration of the etchant results from the weak adhesion and the low density of the monomolecular film or the monomolecular built-up film at the stepped portion. The etching is accelerated by applying an ultrasonic wave during the etching process of the lift-off layer. The pattern formation with accelerated etching can be effected by making the state of the upper surface of the lift-off layer 1-8 different from the surface state of the pattern-forming base surface 1-6, for example in such a manner that the upper surface of the lift-off layer is made hydrophobic and the pattern forming base surface is made hydrophilic, since the monomolecular film or monomolecular built-up film (Y-type film) becomes liable to peel off by the above procedure.

The present invention is described in detail by referring to the following Example.

EXAMPLE 1

The main steps of this embodiment is illustrated in FIG. 2 similar to FIG. 1. The pattern forming surface 2-3 of the flat glass substrate 2-1 was cleaned sufficiently (FIG. 2A). On the entire surface of the pattern forming surface 2-3 of the glass substrate was formed 2000Å-thick Al layer 2-2 by vacuum deposition (FIG. 2B). Then, using a photolithography method, a 1 $\mu$-wide Al layer 2-2 was patterned in stripe with a pitch of 1 $\mu$ to form lift-off layer 2-4 (FIG. 2C). A commercially available dry film was used as a photoresist, and 10% aqueous solution of hydrochloric acid was used as an etchant. The substrate 2-1 carrying a formed lift-off layer 2-4 was cleaned sufficiently and then a mixed monomolecular built-up film 2-5 of arachic acid and merocyanine derivative was formed by the said apparatus of Kuhn (FIG. 2D). The monomolecular film 2-5 was formed according to the method as described below. The substrate 2-1 was immersed in water with the pattern forming surface 2-3 of the substrate kept vertical to the water surface. Then, onto the water surface, added dropwise was $1 \times 10^{-3}$ mol/l chloroform solution of a mixture of arachic acid-merocyanine (mole ratio 5:1) to develop the monomolecular film on the water surface. The surface pressure of the film was controlled to 30 dyne/cm. A mixed monomolecular built-up film 2-5 (Y-type film) in seven layers was formed by withdrawing and dipping substrate 2-1 at a speed of 2 cm/min. Finally, the substrate with the formed monomolecular built-up film was immersed in 10% solution of hydrochloric acid in a vessel placed in an ultrasonic cleaners, and was subjected to an ultrasonic cleaning for 10 minutes. Thus, the Al layer 2-4 as the lift-off layer was removed by etching to form the pattern comprising only the monomolecular built-up film 2-5 on the substrate 2-1 as shown in FIG. 2E.

EXAMPLE 2

This embodiment relates to an application of the pattern forming method of the present invention to the fabrication of a solar battery. The main steps for the fabrication are shown in FIG. 3.

Figure 3A:
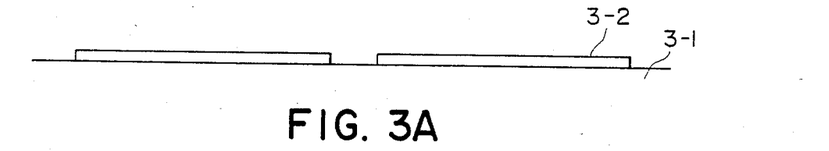
FIGS. 3A–3F shows a further embodiment.

Firstly, an 500Å-thick ITO layer 3-2 as a lower ohmic electrode was deposited on a glass substrate 3-1 using a mask by a vacuum deposition method. The pattern of the ITO layer 3-2 was formed on a substrate 3-1 as shown in FIG. 3A. Each of the ITO layers 3-2 disposed separately on the substrate forms an individual solar battery after the lamination of various layers on the ITO layers, in accordance with the following steps. In this embodiment, three ITO layers 3-2 were disposed on substrate 3-1 (one out of three was not shown in the figure).

Figure 3B:
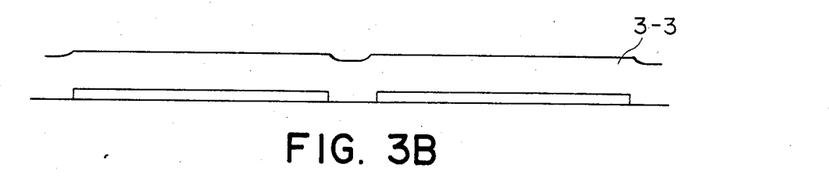
Figure 3C:
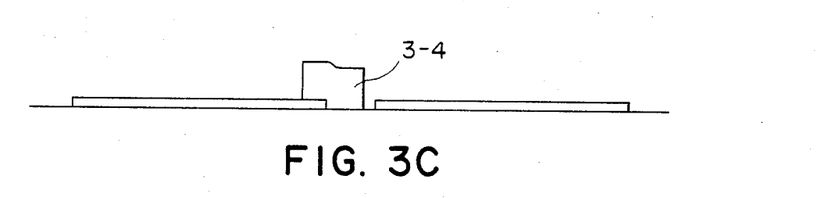
Figure 3D:
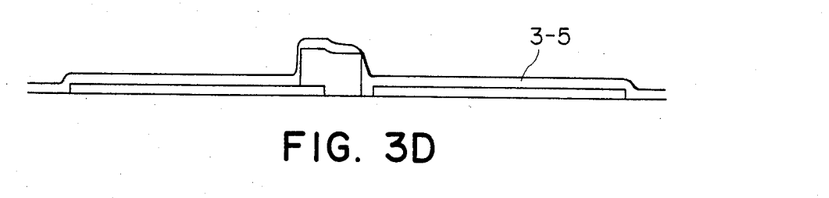
Figure 3E:
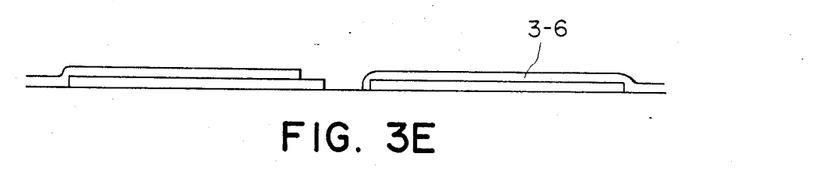
Figure 3F:
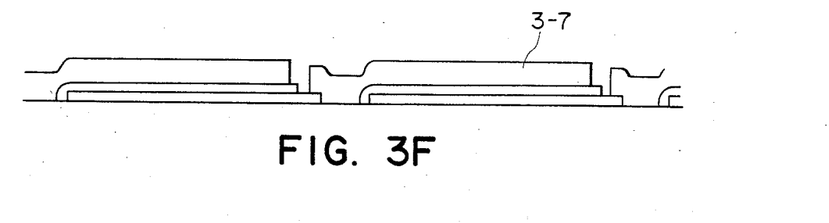

Secondly, 2000Å-thick aluminium layer 3-3 was deposited on substrate 3-1 provided with the ITO layers 3-2 by the vacuum deposition method (FIG. 3B). Then, by the photolithography method, aluminium layer 3-3 was left in a state of islands on the substrate 3-1 as the base and the ITO layer 3-2 as shown in FIG. 3C, giving a lift-off layer 3-4. A portion comprising the lift-off layer 3-4 corresponds to joint of two solar battery. Mixed monomolecular built-up film 3-5 (Y-type) constituted of thirteen layers was formed by the same procedure as in Example 1 except that molar ratio of arachic acid to merocyanine derivative was to 2 to 1 and the concentration thereof in chloroform was $1 \times 10^{-3}$ mol/l (FIG. 3D). Then, the lift-off layer 3-4 was removed by etching in 10% aqueous solution of hydrochloric acid while being exposed to an ultrasonic wave. Thereby, monomolecular built-up film 3-6 as an electrical potential generating portion was formed on the base (FIG. 3E).

Finally, Al layer 3-7 as the upper Schottky electrode was deposited in a thickness of 1000Å with a mask by the vacuum deposition method (FIG. 3F) to obtain the three solar batteries connected in series.

This procedure has made the pattern formation of monomolecular built-up films feasible, and three solar batteries could be connected in series. Consequently, the connection of the three solar batteries in series, each of which has an open circuit voltage of 0.5 V under the illumination of an incandescent lamp (2 mW/cm$^2$ or less), gave the voltage of 1.5 V, and was found to be an effective solar battery.

EXAMPLE 3

Figure 2A:
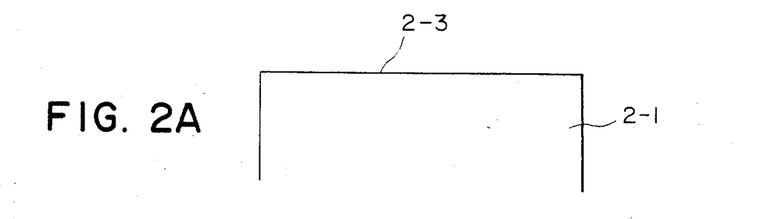
FIGS. 2A–2E shows another embodiment.
Figure 2B:
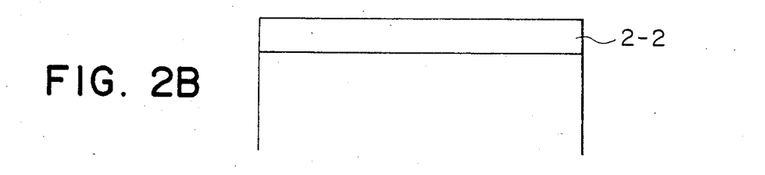
Figure 2C:
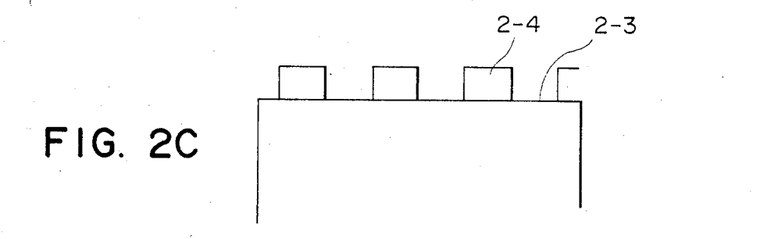

Using a flat glass plate substrate, a lift-off layer 2-4 was formed by the same condition and procedure as in Example 1 (FIG. 2C).

Substrate 2-1 provided with the lift-off layer 2-4 was cleaned sufficiently, and then the monomolecular built-up film 2-5 of a diacetylene derivative $C_{11}H_{23}C\equiv C-C\equiv C-(CH_2)_8COOH$ was formed using the apparatus of Kuhn as described above (FIG. 2D). The monomolecular built-up film 2-5 was formed by the method as described below.

Figure 2D:
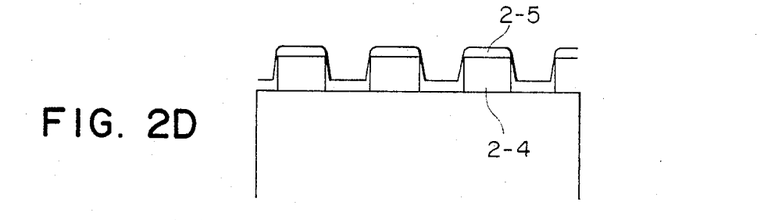

The substrate 2-1 was immersed in aqueous solution of cadmium chloride ($1 \times 10^{-3}$ mol/l, pH 6.2) with the pattern forming surface 2-3 of the substrate kept vertical to the surface of the said aqueous solution. Then, $3 \times 10^{-3}$ mol/l diacetylene derivative solution in chloroform was developed on the surface of the said aqueous solution. Chloroform as a solvent was evaporated off, and then a surface pressure was raised to 20 dyne/cm.

With the surface pressure kept constant, the said substrate having the sufficiently clean hydrophilic surface was withdrawn and dipped slowly through the surface of the aqueous solution at a rate of 1.0 cm/min. thus the monomolecular film of the diacetylene compound being transferred on the said substrate to form the monomolecular built-up film 2-5 (Y-type film) in fourteen layers.

Figure 2E:
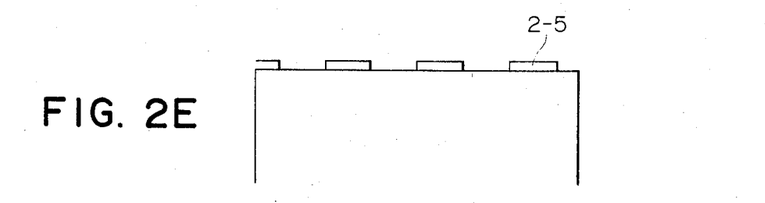

Finally, the substrate with the monomolecular built-up film was immersed in 10% solution of hydrochloric acid in a vessel placed in an ultrasonic cleaner and was subjected to ultrasonic cleaning for 10 minutes. Then the lift-off layer constituted of Al was removed by etching to form the pattern constituted only of the monomolecular built-up film 2-5 on substrate 2-1 as shown in FIG. 2E.

According to the present invention, the provision of the lift-off layer has enabled the patterning of a monomolecular film or a monomolecular built-up film which have been difficult in patterning, and has enabled the intricate combination of the device such as the solar battery and the like.

What is claimed is:

1. A pattern forming method, wherein a pattern of a monomolecular film or a monomolecular built-up film is formed on a base through the steps of providing a lift-off layer on a base on which a monomolecular film or a monomolecular built-up film is to be deposited, depositing the monomolecular film or the monomolecular built-up film on the base and the lift-off layer, and removing the lift-off layer from the base.

2. A pattern forming method according to claim 1, wherein said base comprises an inorganic substrate comprised of glass or SiO$_2$, or an organic substrate comprised of polyethylene, polyethylene terephthalate or polyimide, or a substrate comprised of a metal of Al, Ta, W, In or Cu, or an alloy thereof, on which one of a vapor deposition metal film, a conductive oxide glass and a molecular amorphous semiconductor film is provided.

3. A pattern forming method according to claim 1, wherein said lift-off layer is comprised of a material selected from the group consisting of Al, Mo, Si, Ge, Al$_2$O$_3$ and SiO$_2$.

4. A pattern forming method according to claim 1, wherein the thickness of said lift-off layer is 5–10 times the thickness of said monomolecular film or said monomolecular built-up film.

5. A pattern forming method according to claim 1, wherein said lift-off layer is removed from said base by etching with an etchant.

6. A pattern forming method according to claim 5, wherein said etchant is an aqueous solution of the acid selected from the group consisting of hydrochloric acid, nitric acid, phosphoric acid, hydrofluoric acid and a mixture of nitric acid and hydrofluoric acid.

7. A pattern forming method according to claim 1, wherein said lift-off layer is formed by a vapor deposition method, a sputtering method or a plasma CVD method.

8. A pattern forming method according to claim 1, wherein said monomolecular film or said monomolecular built-up film is formed by Langmuir-Blodgett method.

9. A pattern forming method according to claim 1, wherein said monomolecular film or said monomolecular built-up film comprises a merocyanine derivative or a diacetylene derivative.

* * * * *

UNITED STATES PATENT AND TRADEMARK OFFICE
CERTIFICATE OF CORRECTION

PATENT NO. : 4,586,980

DATED : May 6, 1986

INVENTOR(S) : Yutaka Hirai, et al.

It is certified that error appears in the above-identified patent and that said Letters Patent is hereby corrected as shown below:

```
Column 1, line 27, "reserach" should be --research--.
Column 1, line 68, "monomelecular" should be --monomolecular--.
Column 3, line 53, "a both" should be --both a--.
Column 4, line 14, "therein, more" should be --therein more--.
Column 5, line 19, "subs trate" should be --substrate--.
Column 5, line 44, "monomolecule" should be --monomolecular--.
Column 5, line 48, "immmersed" should be --immersed--.
Column 6, line 50, "Example" should be --Examples--.
Column 7, line 25, "cleaners" should be --cleaner--.
Column 7, line 48, "aluminium" should be --aluminum--.
Column 7, line 51, "aluminium" should be --aluminum--.
Column 7, line 55, "battery." should be --batteries.--
Column 9, line  7, "Al2O3" should be --Al2O3--.
```

Signed and Sealed this

Twenty-fifth Day of November, 1986

Attest:

DONALD J. QUIGG

*Attesting Officer*  *Commissioner of Patents and Trademarks*